US010032646B2

(12) United States Patent
Haba et al.

(10) Patent No.: US 10,032,646 B2
(45) Date of Patent: Jul. 24, 2018

(54) ROBUST MULTI-LAYER WIRING ELEMENTS AND ASSEMBLIES WITH EMBEDDED MICROELECTRONIC ELEMENTS

(71) Applicant: Tessera, Inc., San Jose, CA (US)

(72) Inventors: Belgacem Haba, Saratoga, CA (US); Vage Oganesian, Sunnyvale, CA (US); Kimitaka Endo, Tokyo (JP)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 15/282,255

(22) Filed: Sep. 30, 2016

(65) Prior Publication Data
US 2017/0018440 A1    Jan. 19, 2017

Related U.S. Application Data

(62) Division of application No. 12/287,380, filed on Oct. 8, 2008.
(Continued)

(51) Int. Cl.
*H01L 21/00* (2006.01)
*H01L 21/48* (2006.01)
(Continued)

(52) U.S. Cl.
CPC ........ *H01L 21/486* (2013.01); *H01L 21/4857* (2013.01); *H01L 23/49822* (2013.01);
(Continued)

(58) Field of Classification Search
None
See application file for complete search history.

(56) References Cited

U.S. PATENT DOCUMENTS

| 3,679,941 A | 7/1972 | LaCombe et al. |
| 3,805,375 A | 4/1974 | LaCombe et al. |

(Continued)

FOREIGN PATENT DOCUMENTS

| JP | 2006-019361 | 1/2006 |
| JP | 2006-156669 A | 6/2006 |

(Continued)

OTHER PUBLICATIONS

Wikipedia, "Pre-preg." Retrieved from the internet on Sep. 21, 2017 <https://en.wikipedia.org/wiki/Pre-preg>.*
(Continued)

*Primary Examiner* — David E Graybill
(74) *Attorney, Agent, or Firm* — Lerner, David, Littenberg, Krumholz & Mentlik, LLP

(57) ABSTRACT

An interconnect element 130 can include a dielectric layer 116 having a top face 116*b* and a bottom face 116*a* remote from the top face, a first metal layer defining a plane extending along the bottom face and a second metal layer extending along the top face. One of the first or second metal layers, or both, can include a plurality of conductive traces 132, 134. A plurality of conductive protrusions 112 can extend upwardly from the plane defined by the first metal layer 102 through the dielectric layer 116. The conductive protrusions 112 can have top surfaces 126 at a first height 115 above the first metal layer 132 which may be more than 50% of a height of the dielectric layer. A plurality of conductive vias 128 can extend from the top surfaces 126 of the protrusions 112 to connect the protrusions 112 with the second metal layer.

19 Claims, 10 Drawing Sheets

Related U.S. Application Data

(60) Provisional application No. 60/998,564, filed on Oct. 10, 2007.

(51) Int. Cl.
| | |
|---|---|
| *H01L 23/498* | (2006.01) |
| *H01L 23/538* | (2006.01) |
| *H01L 23/00* | (2006.01) |
| *H01L 25/065* | (2006.01) |
| *H01L 25/10* | (2006.01) |
| *H01L 25/16* | (2006.01) |
| *H05K 3/40* | (2006.01) |
| *H05K 3/46* | (2006.01) |
| *H05K 1/18* | (2006.01) |
| *H05K 3/00* | (2006.01) |

(52) U.S. Cl.
CPC .... *H01L 23/49827* (2013.01); *H01L 23/5389* (2013.01); *H01L 24/24* (2013.01); *H01L 24/82* (2013.01); *H01L 25/0652* (2013.01); *H01L 25/0657* (2013.01); *H01L 25/105* (2013.01); *H01L 25/16* (2013.01); *H05K 3/4038* (2013.01); *H05K 3/4647* (2013.01); *H01L 2224/24226* (2013.01); *H01L 2225/06524* (2013.01); *H01L 2225/06541* (2013.01); *H01L 2225/1023* (2013.01); *H01L 2225/1058* (2013.01); *H01L 2924/014* (2013.01); *H01L 2924/01005* (2013.01); *H01L 2924/01006* (2013.01); *H01L 2924/01013* (2013.01); *H01L 2924/01027* (2013.01); *H01L 2924/01029* (2013.01); *H01L 2924/01033* (2013.01); *H01L 2924/01078* (2013.01); *H01L 2924/01079* (2013.01); *H01L 2924/01082* (2013.01); *H01L 2924/01322* (2013.01); *H01L 2924/14* (2013.01); *H01L 2924/1461* (2013.01); *H01L 2924/19041* (2013.01); *H01L 2924/19042* (2013.01); *H01L 2924/19043* (2013.01); *H01L 2924/30105* (2013.01); *H01L 2924/30107* (2013.01); *H05K 1/185* (2013.01); *H05K 3/0038* (2013.01); *H05K 3/4652* (2013.01); *H05K 2201/0355* (2013.01); *H05K 2201/0361* (2013.01); *H05K 2201/0382* (2013.01); *H05K 2201/096* (2013.01); *H05K 2203/0384* (2013.01); *H05K 2203/0733* (2013.01); *H05K 2203/1189* (2013.01)

(56) References Cited

U.S. PATENT DOCUMENTS

| | | | |
|---|---|---|---|
| 5,091,769 A | 2/1992 | Eichelberger | |
| 5,111,278 A | 5/1992 | Eichelberger | |
| 5,250,843 A | 10/1993 | Eichelberger | |
| 5,353,498 A | 10/1994 | Fillion et al. | |
| 5,442,143 A | 8/1995 | Schmidt et al. | |
| 5,841,193 A | 11/1998 | Eichelberger | |
| 5,950,306 A | 9/1999 | Suzuki et al. | |
| 6,081,988 A | 7/2000 | Pluymers et al. | |
| 6,081,989 A | 7/2000 | Pluymers et al. | |
| 6,083,837 A | 7/2000 | Millet | |
| 6,159,767 A | 12/2000 | Eichelberger | |
| 6,465,730 B1 | 10/2002 | Pluymers et al. | |
| 6,511,865 B1 | 1/2003 | Lin | |
| 6,548,393 B1 | 4/2003 | Lin | |
| 6,562,709 B1 | 5/2003 | Lin | |
| 6,593,224 B1 | 7/2003 | Lin | |
| 6,660,626 B1 | 12/2003 | Lin | |
| 6,700,195 B1 * | 3/2004 | Mandel | H01L 23/40 257/706 |
| 6,759,264 B2 | 7/2004 | Chou et al. | |
| 6,762,076 B2 | 7/2004 | Kim et al. | |
| 7,102,227 B2 | 9/2006 | Terui | |
| 7,158,302 B2 | 1/2007 | Chiu et al. | |
| 7,176,043 B2 | 2/2007 | Haba et al. | |
| 7,176,506 B2 | 2/2007 | Beroz et al. | |
| 7,317,249 B2 | 1/2008 | Crisp et al. | |
| 7,417,299 B2 | 8/2008 | Hu | |
| 7,453,157 B2 | 11/2008 | Haba et al. | |
| 7,462,936 B2 | 12/2008 | Haba et al. | |
| 7,495,179 B2 | 2/2009 | Kubota et al. | |
| 7,545,029 B2 | 6/2009 | Wilson et al. | |
| 7,548,430 B1 | 6/2009 | Huemoeller et al. | |
| 7,550,857 B1 | 6/2009 | Longo et al. | |
| 7,554,206 B2 | 6/2009 | Haba et al. | |
| 7,633,765 B1 | 12/2009 | Scanlan et al. | |
| 7,659,631 B2 | 2/2010 | Kamins et al. | |
| 7,671,457 B1 | 3/2010 | Hiner et al. | |
| 7,709,297 B2 | 5/2010 | Haba et al. | |
| 7,709,968 B2 | 5/2010 | Damberg et al. | |
| 7,719,121 B2 | 5/2010 | Humpston et al. | |
| 7,727,803 B2 * | 6/2010 | Yamagata | H01L 23/49816 257/701 |
| 7,727,806 B2 | 6/2010 | Uhland et al. | |
| 7,745,943 B2 | 6/2010 | Haba et al. | |
| 7,816,251 B2 | 10/2010 | Haba et al. | |
| 7,939,934 B2 | 5/2011 | Haba et al. | |
| 7,999,397 B2 | 8/2011 | Haba et al. | |
| 8,046,912 B2 | 11/2011 | Kubota et al. | |
| 8,058,101 B2 | 11/2011 | Haba et al. | |
| 8,093,697 B2 | 1/2012 | Haba et al. | |
| 8,207,604 B2 | 6/2012 | Haba et al. | |
| 8,329,581 B2 | 12/2012 | Haba et al. | |
| 8,531,039 B2 | 9/2013 | Damberg et al. | |
| 8,580,607 B2 | 11/2013 | Haba | |
| 8,604,348 B2 | 12/2013 | Kubota et al. | |
| 8,641,913 B2 | 2/2014 | Haba et al. | |
| 8,723,318 B2 | 5/2014 | Haba | |
| 8,728,865 B2 | 5/2014 | Haba et al. | |
| 2001/0036750 A1 | 11/2001 | Radens et al. | |
| 2004/0222518 A1 * | 11/2004 | Haba | H01L 23/3114 257/734 |
| 2005/0097727 A1 | 5/2005 | Iijima et al. | |
| 2005/0116326 A1 | 6/2005 | Haba et al. | |
| 2005/0140019 A1 | 6/2005 | Watanabe | |
| 2005/0173805 A1 | 8/2005 | Damberg et al. | |
| 2005/0181544 A1 | 8/2005 | Haba et al. | |
| 2005/0181655 A1 | 8/2005 | Haba et al. | |
| 2005/0284658 A1 | 12/2005 | Kubota et al. | |
| 2005/0285246 A1 | 12/2005 | Haba et al. | |
| 2006/0001166 A1 * | 1/2006 | Igarashi | H01L 23/3128 257/758 |
| 2006/0019414 A1 | 1/2006 | Wang et al. | |
| 2006/0033189 A1 * | 2/2006 | Haba | B81B 7/007 257/678 |
| 2006/0068577 A1 | 3/2006 | Lee et al. | |
| 2006/0126313 A1 | 6/2006 | Steiner et al. | |
| 2006/0138647 A1 | 6/2006 | Crisp et al. | |
| 2006/0249857 A1 | 11/2006 | Haba et al. | |
| 2007/0077677 A1 | 4/2007 | Haba et al. | |
| 2007/0096160 A1 | 5/2007 | Beroz et al. | |
| 2007/0141759 A1 * | 6/2007 | Nagase | H01L 23/5389 438/126 |
| 2007/0148822 A1 | 6/2007 | Haba et al. | |
| 2007/0152320 A1 * | 7/2007 | Yamagata | H01L 23/49816 257/701 |
| 2007/0205496 A1 | 9/2007 | Haba et al. | |
| 2007/0209199 A1 | 9/2007 | Iijima et al. | |
| 2008/0000680 A1 | 1/2008 | Cho et al. | |
| 2008/0003402 A1 | 1/2008 | Haba et al. | |
| 2008/0042250 A1 | 2/2008 | Wilson et al. | |
| 2008/0088033 A1 | 4/2008 | Humpston et al. | |
| 2008/0150101 A1 | 6/2008 | White et al. | |
| 2008/0160675 A1 | 7/2008 | Haba et al. | |
| 2008/0185705 A1 | 8/2008 | Osborn et al. | |
| 2009/0071000 A1 | 3/2009 | Haba et al. | |
| 2009/0115047 A1 | 5/2009 | Haba et al. | |
| 2009/0133254 A1 | 5/2009 | Kubota et al. | |
| 2010/0193970 A1 | 8/2010 | Damberg et al. | |
| 2010/0232129 A1 | 9/2010 | Haba et al. | |

(56) References Cited

U.S. PATENT DOCUMENTS

| | | |
|---|---|---|
| 2010/0258956 A1 | 10/2010 | Haba et al. |
| 2011/0165733 A1 | 7/2011 | Haba et al. |
| 2011/0260320 A1 | 10/2011 | Kubota et al. |
| 2011/0269272 A1 | 11/2011 | Haba et al. |
| 2013/0026644 A1 | 1/2013 | Yu et al. |
| 2014/0008816 A1 | 1/2014 | Yoda |

FOREIGN PATENT DOCUMENTS

| | | |
|---|---|---|
| JP | 2006-165133 A | 6/2006 |
| JP | 2006-196785 A | 7/2006 |
| JP | 2006-339261 A | 12/2006 |
| JP | 2007173276 A | 7/2007 |
| KR | 100751955 B1 | 8/2007 |

OTHER PUBLICATIONS

International Search Report PCT/US2008/011632 end Jul. 14, 2009.
Japanese Office Action dated Nov. 2, 2012 for Patent Application No. 2010/528888.
Japanese Office Action for Application No. 2010-528888 dated Oct. 18, 2013.
Extended European Search Report for Application No. 08837045.7 dated Aug. 4, 2011.
Korean Office Action for Application No. 10-2010-7010116 dated Sep. 26, 2014.

* cited by examiner

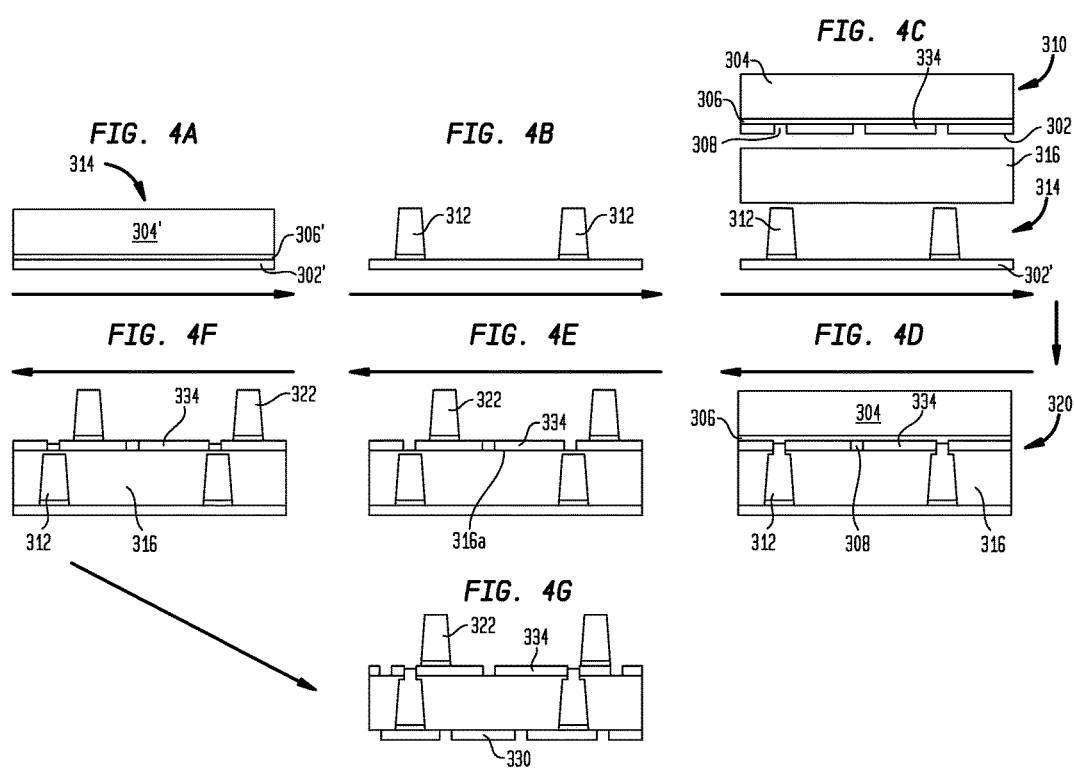

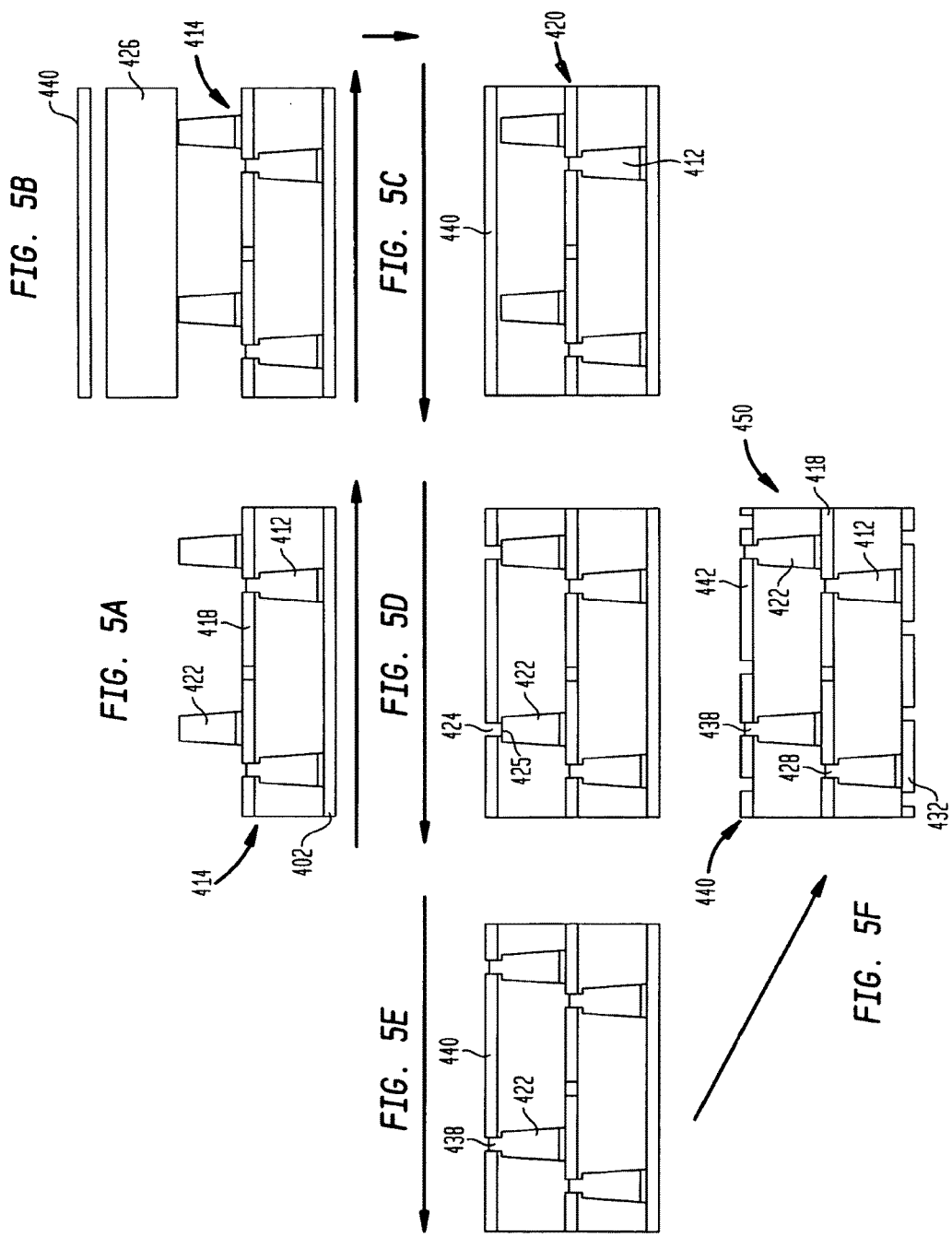

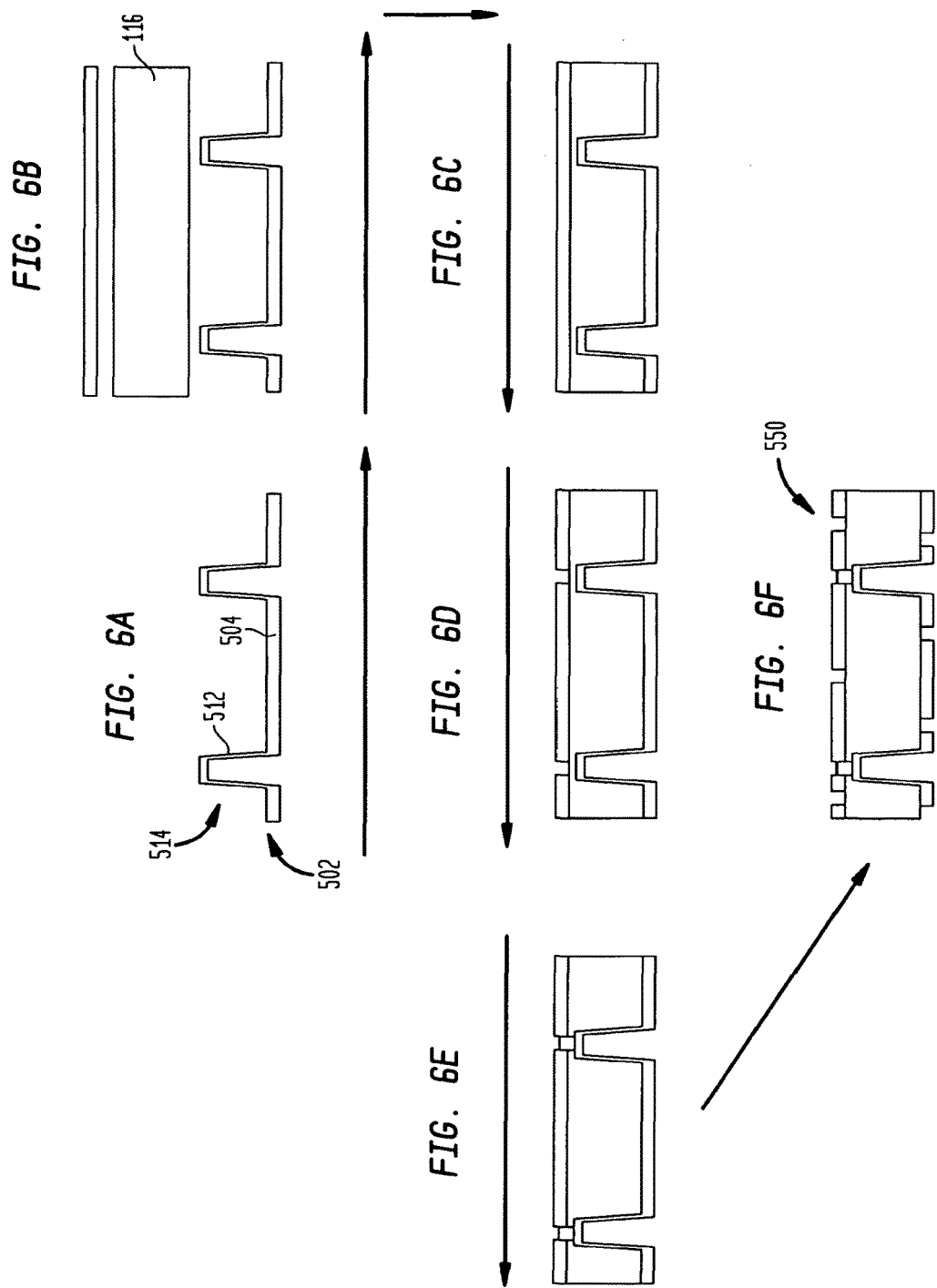

ROBUST MULTI-LAYER WIRING ELEMENTS AND ASSEMBLIES WITH EMBEDDED MICROELECTRONIC ELEMENTS

CROSS REFERENCE TO RELATED APPLICATIONS

This application is a divisional of U.S. application Ser. No. 12/287,380, filed on Oct. 8, 2008, the disclosure of which is incorporated herein by reference. Said application claims the benefit of the filing date of U. S. Provisional Patent Application No. 60/998,564, filed Oct. 10, 2007, the disclosure of which is incorporated herein by reference.

BACKGROUND OF THE INVENTION

The subject matter of the present application relates to multi-layer wiring elements and their fabrication, such as used in the packaging of, or in the connection to microelectronic elements, particularly semiconductor integrated circuits.

The packaging of microelectronic elements, e.g., semiconductor integrated circuits continually poses new challenges. Processor chips pose particular challenges, due to the large area over which they typically extend, the great number of external contacts which typically are present as pinout at the external signal interface of the chip, and large fluctuations in temperature to which they are subject, because of high operating temperatures of processor chips. Moreover, the pitch and the size of the contacts of the chip are each becoming smaller as the number of external contacts of the chip increases.

Surface mount technology including flip-chip interconnect technology, has been frequently used to interconnect such chips. Flip-chip interconnects can be formed quickly and reliably by holding a semiconductor chip with solder bumps thereon in contact with corresponding lands of a chip carrier and then heating the chip with the chip carrier to a point at which the solder bumps melt and form joints with the lands of the chip carrier. Often, solder bumps are used which contain a high-lead content solder. Among advantages of the high-lead solder is that it tends to yield to thermal and mechanical stresses within the package. Recently however, industry is trending away from use of high-lead content solder, or rather, towards increased use of lead-free solder. Currently, the future use of lead-containing solder is in question.

Apart from the trend towards lead-free solders, the packaging of microelectronic chips poses significant challenges, particularly the reduction in pitch and size of contacts, high power density, and large area of certain chips such as processor chips.

SUMMARY OF THE INVENTION

An interconnect element can include a dielectric layer having a top face and a bottom face remote from the top face. A first metal layer may define a plane extending along the bottom face and a second metal layer can extend along the top face. One of the first or second metal layers, or both, can include a plurality of conductive traces. A plurality of conductive protrusions can extend upwardly from the plane defined by the first metal layer through the dielectric layer. The conductive protrusions can have top surfaces at a first height above the first metal layer. The first height can be greater than 50% of a height of the dielectric layer above the first metal layer, for example. A plurality of conductive vias can extend from the top surfaces through openings in the dielectric layer to conductively connect the conductive protrusions with the second metal layer. At least one of the conductive vias can have a first width in contact with the top surface of the conductive protrusion. The first width can be less than a width of the top surface.

An interconnect element can include a dielectric layer having a top face and a bottom face remote from the top face. A first metal layer can define a plane extending along the bottom face and a second metal layer can extend along the top face. One of the first or second metal layers, or both, can include a plurality of conductive traces. A plurality of conductive protrusions can extend upwardly from the plane defined by the first metal layer through the dielectric layer, and a plurality of plated features can extend through openings in the dielectric layer to conductively connect the conductive protrusions with the second metal layer.

A packaged microelectronic element can include a dielectric layer having a top face and a bottom face remote from the top face. A first metal layer can define a plane extending along the bottom face and a second metal layer can extend along the top face. One of the first or second metal layers, or both, can include a plurality of conductive traces. A plurality of conductive protrusions can extend upwardly from the plane defined by the first metal layer through the dielectric layer and a microelectronic element disposed between the first and second wiring layers. The microelectronic element can have a contact-bearing face separated from the second metal layer by the dielectric layer. A plurality of plated features, can extend through openings in the dielectric layer to conductively connect the conductive protrusions and contacts of the microelectronic element with the second metal layer.

A multiple wiring layer interconnect element having at least one of an active or passive component incorporated therein can include a dielectric layer having a top face and a bottom face remote from the top face. A first metal layer can define a plane extending along the bottom face and a second metal layer can extend along the top face. At least one of the first and second metal layers can include a plurality of conductive traces. A plurality of conductive protrusions can extend from the plane upwardly through the dielectric layer. The at least one of an active or passive component can be disposed between the first and second metal layers. The component can have a plurality of terminals confronting the second metal layer and separated from the second metal layer by the dielectric layer. A plurality of plated features can extend through openings in the dielectric layer to conductively connect the conductive protrusions and the terminals of the component with the second metal layer.

A method of fabricating an interconnect element having a plurality of wiring layers separated from each other by at least one dielectric layer can include laminating a dielectric layer and a first metal layer atop the dielectric layer onto a base element. The base element can include, for example, a second metal layer having at least portions defining a plane and a plurality of conductive protrusions extending upwardly from the plane. Portions of the dielectric layer may separate adjacent ones of the conductive protrusions. The method can include forming openings in the dielectric layer which expose at least top surfaces of the conductive protrusions. A metal can be plated onto the exposed surfaces of the conductive protrusions within the openings to form plated features connecting the conductive protrusions with the first metal layer.

A method of packaging a microelectronic element between wiring layers of an interconnect element having a plurality of wiring layers separated from each other by at least one dielectric layer can include laminating a dielectric layer and a first metal layer atop the dielectric layer onto a first element. The first element can include, for example, a second metal layer having at least portions defining a plane, a plurality of conductive protrusions extending upwardly from the plane and a microelectronic element having a first face adjacent to the plane. The step of laminating can be performed such that portions of the dielectric layer separate adjacent ones of the conductive protrusions and separate the microelectronic element from the conductive protrusions. The method can include forming openings in the dielectric layer which expose contacts at a second face of the microelectronic element and at least top surfaces of the conductive protrusions. The method can also include plating a metal onto the exposed contacts and exposed surfaces of the conductive protrusions within the openings to form plated features connecting the contacts and the conductive protrusions with the first metal layer.

A method is provided in accordance with an embodiment for forming an interconnect element including at least one of an active or passive component between respective wiring layers of the interconnect element, wherein a plurality of wiring layers are separated from each other by at least one dielectric layer. A dielectric layer and a first metal layer atop the dielectric layer can be laminated onto a first element. The first element can include a second metal layer having at least portions defining a plane, a plurality of conductive protrusions extending upwardly from the plane and at least one of an active or passive component having a surface overlying the plane. The step of laminating can be performed such that portions of the dielectric layer separate adjacent ones of the conductive protrusions and the component from each other. Openings may be formed in the dielectric layer which can expose contacts of the component and at least top surfaces of the conductive protrusions. A metal may be plated onto the exposed contacts and exposed surfaces of the conductive protrusions within the openings to form plated features connecting the contacts and the conductive protrusions with the second metal layer.

Further, in an embodiment of the present invention, the method as set forth herein can include after forming the plated features, patterning the first and second metal layers to form wiring patterns. Hollow metal protrusions may be formed, for example, by stamping or by plating a metal layer onto surfaces of a mandrel followed by removing the mandrel. A metal layer can coat the inner walls of the recesses of the mandrel to form hollow conductive protrusions. The hollow conductive protrusions can have continuous metal surfaces extending away from the plane. A metal layer can be used to fill the recesses of the mandrel to form solid conductive protrusions.

In an embodiment of the present invention, the first metal layer can include the planar portions and the hollow conductive protrusions can extend continuously away from the planar portions. The hollow conductive protrusions can have a frustoconical shape. The method as set forth herein can also include, after forming the plated features, patterning a fourth metal layer to form wiring patterns and after forming the second plated features, patterning the first and fourth metal layers to form wiring patterns.

BRIEF DESCRIPTION OF THE DRAWINGS

FIGS. 4(a) through 4(g) are sectional views illustrating stages in a method of fabricating a multi-layer wiring element in accordance with a variation of the embodiment illustrated in FIGS. 1(a)-(g).

FIGS. 4(f)' and 4(g)' are sectional views illustrating stages in a variation of the method of fabricating a multi-layer wiring element illustrated in FIGS. 4(a)-(g).

FIGS. 5(a) through 5(f) are sectional views illustrating stages in a method of fabricating a multi-layer wiring element in accordance with a variation of the embodiment illustrated in FIGS. 4(a)-(g).

FIGS. 6(a) through 6(f) are sectional views illustrating stages in a method of fabricating a multi-layer wiring element in accordance with a variation of the embodiment illustrated in FIGS. 1(a)-(g).

DETAILED DESCRIPTION

Figure 1:
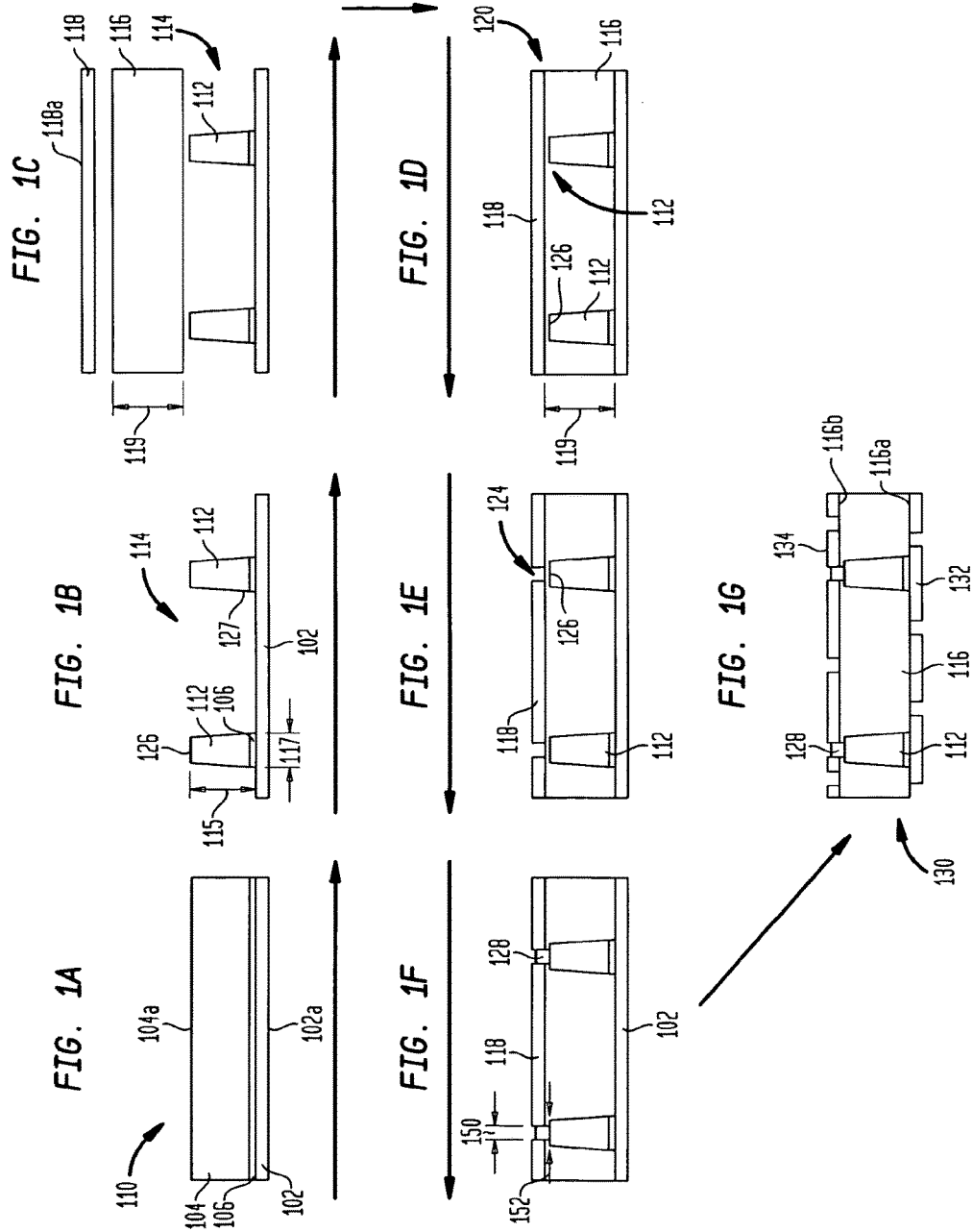
FIGS. 1(a) through 1(g) are sectional views illustrating stages in a method of fabricating a multi-layer wiring element such as a circuit panel having multiple layers of wiring patterns, in accordance with an embodiment of the invention.

As used in this disclosure, a feature such as a terminal, contact or pad which is "exposed at" a surface of a dielectric element may be flush with such surface; recessed relative to such surface; or protruding from such surface, so long as the feature is accessible for contact by a theoretical point moving towards the surface in a direction perpendicular to the surface.

FIG. 1(a) through FIG. 1(g) illustrate stages in a method of fabricating an interconnect element such as a multi-layer wiring element in accordance with an embodiment of the invention. As illustrated in FIG. 1(a), a layered metal structure 110 includes a relatively thin metal layer 102 having a thickness between about three and 25 micrometers (μm or "microns") and a thicker metal layer 104 having a thickness between about 30 microns and 200 microns. Typically, each of the metal layers 102, 104 has an exposed surface 102a, 104a, respectively, which defines a plane. In an exemplary embodiment, the thin metal layer 102 has a thickness of less than about 10 microns and the thicker metal layer 104 has a thickness between about 25 microns and 50 microns. In one embodiment, the metal layer 102 has an exposed surface 102a which defines a continuous plane.

An intermediate layer 106 having a different composition from the two layers 102, 104 is disposed between the two metal layers 102, 104. The intermediate layer 106 can be of such composition that it is not attacked by an etchant or etchants which attack either one or both of the metal layers 102, 104. In one embodiment, each of the two metal layers 102, 104 consist essentially of copper and the intermediate layer 106 includes or consists essentially of nickel. In such way, when an etchant which attacks copper is applied to one of the exposed faces 102a, 104a of the metal layers 102, 104, the intermediate layer 106 functions as an etch stop layer to prevent the etchant from penetrating beyond the intermediate layer 106 and possibly attacking the other one of the metal layers 102, 104 that is remote from the exposed face.

As illustrated in FIG. 1(b), the metal layer 104 is patterned by lithography to form solid metal posts extending upwardly above the metal layer 102. Typically, the solid metal posts have a height 115 which is about equal to the original thickness of the metal layer 104 above the intermediate layer 106. Each of the solid metal posts typically has a height 115 which is at least about half a diameter 117 or width of each post, such that the height to width aspect ratio is about ½ or greater. However, in a particular embodiment, there is no requirement that the posts have a minimum aspect ratio. In a particular embodiment, the metal posts have frusto-conical or pyramidal shape. In another embodiment, the metal posts can have cylindrical shape.

In an example of forming the metal posts, a photoresist layer (not shown) can be deposited and developed to form mask patterns overlying layer 104. The layered metal structure 110 can then be etched selectively with respect to the intermediate layer 106 to form the conductive posts 112. Such processing tends to form metal posts which have frusto-conical shape, wherein walls 127 of the posts are sloped away from the top surface 126. Subsequently, the intermediate layer can be removed where exposed between the conductive posts using a different etch process performed selectively with respect to the posts and metal layer 102. The metal layer 102 and the conductive posts extending upwardly therefrom form a base element 114 to which additional processing is applied in subsequent steps.

As illustrated in FIG. 1(c), a dielectric layer 116 and another relatively thin metal layer 118 atop the dielectric layer are now laminated to the base element 114. The metal layer 118 can be such as or similar to the metal layer 102 described above and can have an exposed surface 118a which defines a continuous plane. There are many different types of dielectric materials and processes which can be used to form the laminated structure. Lamination processes can also vary. For example, the dielectric layer 116 and the metal layer 118 can be laminated in one simultaneous step with the base element to form a laminated structure 120 (FIG. 1(d)) by applying heat and pressure with the metal layer 118, dielectric layer 116 and base element 114 sandwiched between pressure-bearing plates of a press. In another example, the dielectric layer 116 can be first laminated to the base element, after which the metal layer 118 is laminated to an exposed surface of the dielectric layer 116 to form the structure 120. In one particular embodiment, the material and characteristics of the dielectric layer and the type of lamination process can be selected such that lamination can be performed at a relatively low temperature of less than about 200° C. and with a relatively low pressure, such as less than 20 kilograms of force per square centimeter.

In such embodiment, in a particular example, the dielectric layer can include an uncured dielectric element, such as uncured dielectric portions in a "pre-preg", such element containing a curable dielectric such as an epoxy among others, and an embedded glass cloth, for example. Curing of such dielectric element can occur as a result of the heat and pressure applied during a simultaneous lamination process when the dielectric layer is joined with the base element 114 and the overlying metal layer 118 or during subsequent treating. Such uncured dielectric layer can be selected for additional properties such as relatively low coefficient of thermal expansion ("CTE"), and relative rigidity, i.e., having a Young's modulus (modulus of elasticity) which is not very low. Desirably, peel strength of the dielectric layer should not be too low.

In embodiments where the metal layer 118 is laminated sequentially after the dielectric layer 116 is laminated to the base element, the dielectric layer 116 may have a rough surface or smooth surface prior to lamination of the metal layer 118 thereto. The surface roughness of particular dielectric materials can vary widely. Certain dielectric materials such as particular pre-preg type layers can have a surface roughness ranging between about 500 nm and 700 nm prior to laminating the metal layer thereto. In a particular example of a sequential lamination process, a dielectric layer 116 having a thickness of about 50 microns and characteristics such as described below can be laminated to the base element at a temperature of about 100° C. for 30 seconds with pressure of 7 kg/cm² applied, then at 100° C. for 60 seconds with a pressure of 5.5 kg/cm² applied thereto. A post lamination treatment known as "PET", which may include chemical, laser or plasma treatment, may be applied to an exposed surface 116a of the dielectric layer at this time to help cure the dielectric layer or alter surface characteristics of the dielectric layer. A desmear process may be performed to remove smear from an exposed surface 116a of the dielectric layer 116 and to improve adhesion strength. Subsequently, the metal layer 118 having characteristics such as described above can be laminated to the structure including the base element and the dielectric layer 116 at a temperature held at about 120° C. for moderate time intervals, such as 30 to 60 seconds, with pressure of 7 kg/cm² applied, and can be further treated by applying a temperature of about 120° C. to the dielectric layer for 90 seconds with a pressure of 5.5 kg/cm² applied thereto.

FIG. 1(d) illustrates the resulting structure 120 after lamination of the dielectric layer 116 and the metal layer 118. At the temperature and pressure applied during lamination, portions 122 of the dielectric layer 116 may separate the metal posts 112 from the metal layer 118. The top surfaces 126 of the metal posts 112 can be separated from the metal layer 118 by distances up to a few tens of microns. In a particular example, where the thickness 119 of the dielectric layer is about 50 microns, the separation distance can range up to a value of somewhat less than 25 microns, such that the height 115 (FIG. 1(b)) of the metal posts 112 is greater than 50% of the thickness 119 of the dielectric layer 116. More typically, the separation distance between the top surfaces 126 of the metal posts 112 and the metal layer 118 in such example is less than 20 microns, and can be significantly less than 15 microns.

Subsequently, as illustrated in FIG. 1(e)-(f), processing is performed which connects the metal posts 112 with the metal layer 118. In one example, a laser ablation process such as laser drilling can be performed (FIG. 1(e)) to form holes 124 which extend through the metal layer 118 and the intervening portions of the dielectric layer to expose top surfaces 126 of the metal posts. As examples, a focused beam from a YAG laser or $CO_2$ laser is used to form the holes. In another example, the holes 124 can be formed by lithography in accordance with openings in a contact mask or photoresist mask (not shown) overlying the metal layer 118. Subsequently, as illustrated in FIG. 1(f), conductive connectors 128 are formed in the holes 124 which extend between at least the top surfaces 126 of the metal posts 112 and the metal layer 118. The conductive connectors 128 can also be referred to as micro-vias. In one example, the conductive connectors 128 are formed by plating a metal within the openings which then forms conductors which bridge the separation between the posts 112 and the metal layer 118. For example, the process can be performed by plating copper into the openings in contact with top surfaces 126 of the metal posts 112 and metal layer 118. During such process, the metal layer 102 and posts 112 or the metal layer 118 or all can serve as a plating electrode. The process may be performed via electroplating directly onto the exposed top surfaces 126 of the metal posts or, alternatively, via electrolessly plating a seed layer, followed by electroplating.

Alternatively, the conductive connectors 128 can be formed by other methods, such as, for example, screening or stenciling of a conductive matrix material, e.g., a conductive paste such as a metal-filled epoxy, solder paste, among many others, which is then cured by post-treatment. In another example, the conductive connectors 128 can be formed by vapor deposition, e.g., physical vapor deposition (sputtering), which may or may not be followed by subsequent plating. In yet another example, the conductive connectors 128 can be formed by introducing a fusible metal such as a solder, tin or eutectic composition into the holes 124 so as to wet top surfaces 126 of the metal posts. 112.

As illustrated in FIG. 1(f), the width 150 of each micro-via typically is less than the entire width 152 of the metal posts 112 at the top surface 126. The area of the micro-via in contact with the top surface may actually be less than an area of the top surface 126. In a particular embodiment, the maximum area of the hole in the dielectric layer in which the micro-via is formed can be smaller than the maximum area occupied by the post 112 at the height 115 of the post 112 above the metal layer.

Processing or structural advantages may be realized when the width 150 of the micro-via is less than the width 152 of the top surface 126 of the metal post 112, or particularly, when the maximum area of the hole 124 in the dielectric layer is smaller than the area of the metal post 112 at the top surface. For example, if plating is used to form the micro-vias, less time may be needed to do so under such condition. Alternatively, if solder or a conductive matrix is included in the micro-via, better control may be attained over the amount of material needed to bridge the separation distance between the top surface of the metal post 112 and the metal layer 118.

Subsequently, the metal layers 102, 118 of the structure shown in FIG. 1(f) can be patterned lithographically to form individual wiring patterns. A completed interconnect element 130, illustrated in FIG. 1(g), includes conductive traces 132, 134 exposed at a bottom surface 116a and a top surface 116b of the dielectric layer 116. Some of the conductive traces 132 exposed at the bottom surface 116a conductively connect with some of the metal posts 112. Some of the metal posts, in turn, are conductively connected to some of the wiring patterns 134, e.g., conductive traces exposed at the top surface 116b through the connectors 128.

As further illustrated in plan view (FIG. 2), the wiring patterns 134 may form connections between a plurality of the metal posts through the conductive connectors 128. The wiring patterns may also include conductive mounting pads 136 available for attachment of other elements, e.g., active or passive devices or microelectronic elements thereto. The wiring patterns may also include ground or power transmission planes, various conductors or transmission line elements for maintaining ground or a power supply voltage or transmitting signals. In a particular embodiment, particular conductors of the wiring patterns 132, 134 can form a microstrip transmission line, separated by the thickness 119 (FIG. 1(d)) of the dielectric layer.

Figure 3A:
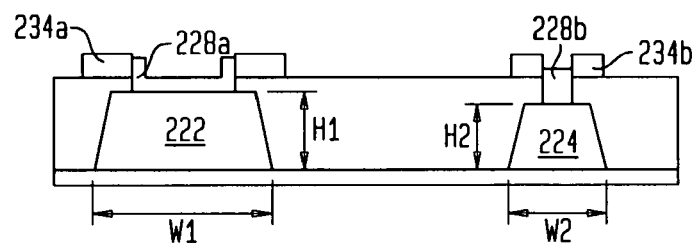
FIG. 3(a) is a sectional view illustrating a particular example of a multi-layer wiring element fabricated in accordance with the embodiment illustrated in FIGS. 1(a) through 1(g).
Figure 3B:
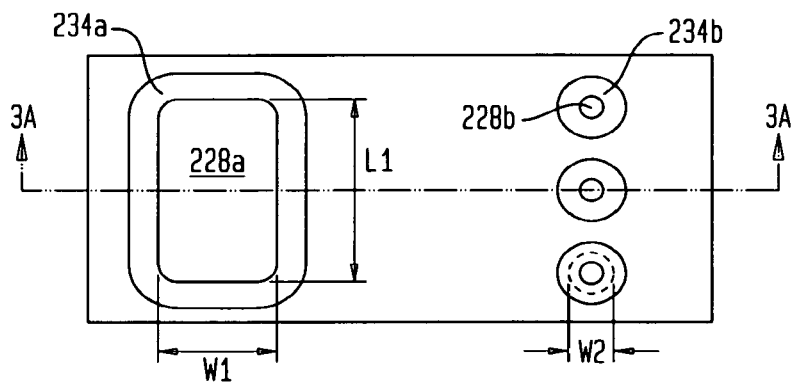
FIG. 3(b) is a plan view of a face of the multi-layer wiring element shown in FIG. 3(a).

While the diameter and height of each metal post can be the same as in the above-described embodiment, in a particular embodiment, the heights H1, H2 (FIG. 3(a)) of the metal posts above a wiring layer can vary at different locations of the structure. As illustrated in FIG. 3(a), the height H1 of post 222 is significantly greater, e.g., several microns to tens of microns greater, than the height H2 of post 224. Moreover, the widths W1, W2 of the metal posts can also vary to significant degrees. The plated or otherwise-formed conductive connectors 228a, 228b shown in FIG. 3(a) overcome the differences in the heights and widths of the metal posts 222, 224 and connect each post to corresponding wiring patterns 234a, 234b. Moreover, the horizontal dimensions (width and length) of a metal post need not be the same and neither the width nor the length of a post need be the same as that of another metal post. For example, as illustrated in plan view in FIG. 3(b), a metal post can have an oblong or rectangular shape, having a length L1 greater than the width W1.

Several possible advantages can be realized in accordance with the embodiment of the invention described above. The amount of time required to fabricate a multi-layer wiring element as shown in FIG. 1(g) can be reduced in comparison to the time required to fabricate other similar multi-layer wiring elements which do not have the above-described conductive connectors 128. Costs of materials, manufacture or both may also be reduced. The method also permits wiring elements to be fabricated in which the sizes (horizontal dimensions and height) of metal posts therein can vary substantially. The wiring element can, in some cases, accommodate metal posts having different (small or large) pitches, as well. In addition, because the metal posts are solid, capacitance and inductance can be reduced in some cases in comparison to wiring elements having hollow or cylindrical plated metal features such as plated through holes for connecting the first and second metal layers. In addition, when solid metal posts are used, power consumption, current density and hence, electromigration can also be reduced, increasing the durability of the wiring element.

Several possible variations of the above process of forming a multi-layer wiring element are worth noting at this time. In one variation, metal layer 102 can be patterned to form wiring patterns before the metal layer 104 is patterned to form the metal posts 112 (FIG. 1(b)). For example, the metal layer 102 can be patterned by lithography performed via selectively etching metal layer 102 with respect to the intermediate layer 106 used as an etch stop layer. Then, prior to etching the metal posts, the 110 structure with the wiring patterns defined therein can be attached temporarily to a carrier, which will remain in place until after the conductive connectors 128 are formed. During the lamination process, the dielectric layer 116 may fill spaces between adjacent wiring patterns such that the wiring patterns may become more similar to damascene (inlaid) wiring patterns having exposed surfaces which are flush with the exposed surface of the dielectric layer between adjacent wiring patterns.

In another variation of the above, the metal layer 118 can have through holes pre-formed, e.g., pre-punched, pre-drilled, or pre-etched therein. During the lamination process (FIG. 1(c)), the pre-formed through holes of the metal layer 118 are aligned with the underlying posts 112 such that upon forming the structure 120 (FIG. 1(d)), the portions 122 of the dielectric layer overlying the posts 112 are exposed within such holes. In a particular embodiment, prior to the lamination step illustrated in FIG. 1(c), the metal layer 118 may already be patterned into wiring patterns similar to the patterns 134 illustrated in FIG. 1(g) and already be joined with the dielectric layer 116 when the lamination process (FIG. 1(c)) is performed.

In a further variation, the dielectric layer 116 may also have holes pre-formed therein at the time the dielectric layer is laminated to the base element 114. In a case where the dielectric layer 116 and the overlying metal layer 118 both have holes pre-formed therein, a subsequent step of forming holes 124 (FIG. 1(e)) can be omitted.

In another variation, instead of forming the posts 112 and wiring patterns by etching a layered metal structure 110 (FIG. 1(a)) selectively with respect to an intermediate layer 106, the metal posts are formed by etching from a top surface of a single, relatively thick, e.g., 25 to 50 microns thick metal layer via a timed etch in accordance with pre-defined mask patterns thereon. Subsequently, the wiring patterns are formed by a timed process of etching from a bottom surface of the same relatively thick metal layer.

In yet another variation, the posts 112 can include or consist essentially of a conductive matrix material, e.g., a conductive paste, among others. In such case, the posts 112 can be formed, for example, by screening or stenciling onto the metal layer 102. In one embodiment, the posts 112 can be formed by screening or stenciling into openings in a sacrificial layer or mandrel, followed by removal of such sacrificial layer or mandrel to expose the posts.

Figure 4F:
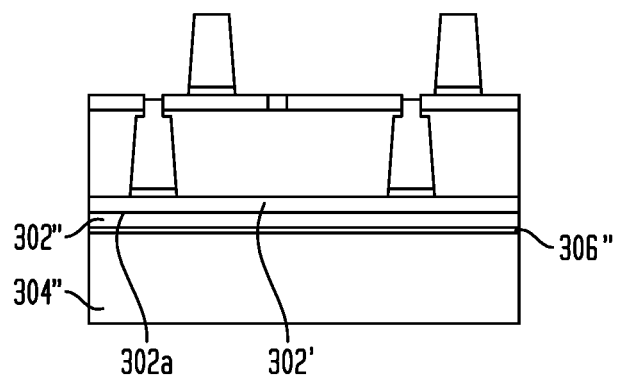

Referring to FIGS. 4(a) to 4(g), a method is provided for fabricating an interconnect element in accordance with another embodiment of the invention similar to that described above (FIGS. 1(a)-(g)). FIGS. 4(a)-(b) illustrate stages in processing which are the same as those shown and described above with respect to FIGS. 1(a)-(b) above or the above-described variations thereof. As illustrated in FIG. 4(c), a second layered metal structure 310 includes a first metal layer 302, a second metal layer 304 and an intermediate layer 306 between them. Optionally, the second metal layer 304 can be thicker than the first metal layer 302. In one embodiment, the layered metal structure 310 has dimensions and properties similar to those of the above-described layered metal structure 110 (FIG. 1(a)). However, prior to the lamination step, metal layer 302 of the layered structure 310 is patterned to form holes 308, such as by a masked etch performed selectively with respect to an intermediate layer 306 of the layered structure. In addition to having holes, the metal layer 302 may already be patterned to form individual wiring patterns 334.

The second layered metal structure 310 is positioned atop a dielectric layer 316 which has properties similar to dielectric layer 116 (FIG. 1(c)) described above, and the structure 310 then is laminated with the dielectric element 316 and the base element 314 having posts 312 protruding upward from a third metal layer 302' to form the structure 320 illustrated in FIG. 4(d). As shown in FIGS. 4(a)-4(b), like FIG. 1(a)-1(b), the first layered metal structure 314 can include a third metal wiring layer 302', as well as metal layers 304' and 306', wherein the posts 312 are formed from patterning the metal layer 304' and extend away from the third metal wiring layer 302'.

Figure 4G:
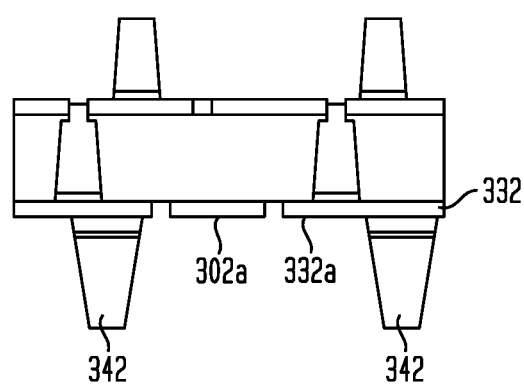

Subsequently, as illustrated in FIG. 4(e), the second metal layer 304 is patterned lithographically to form second metal posts 322 which protrude above the wiring patterns 334 overlying a top surface 316a of the dielectric layer 316. After forming the second metal posts 322, the intermediate layer 306 (FIG. 4(c)) can be removed such that the wiring layer 302 is exposed above the top surface 316a of the dielectric layer. Referring to FIGS. 4(f) and 4(g), processing is then performed in a manner such as described above with respect to FIGS. 1(f) and 1(g) above, resulting in the structure having second posts 322 protruding above the wiring patterns 334, as illustrated in FIG. 4(g). However, the metal layer 334 may not need to undergo patterning at this time, if individual wiring patterns have already been defined previously in accordance with the processing described above with respect to FIG. 4(c).

In a variation of the above embodiment shown in FIGS. 4(f)' and 4(g)', the structure illustrated in 4(f) can have two additional metal layers 306" and 304" underlying the bottom surface 302a of the third metal wiring layer 302'. These layers can remain from an initial layered structure (FIG.4(a)) which contains five layers rather than the three shown therein. The layer 306" is an intermediate layer and layer 304" is a relatively thick layer of a metal different from that of which layer 306" essentially consists. Like layer 306 (FIG. 4(c)), layer 306' functions as an etch stop layer when selectively etching layer 304" in accordance with mask patterns (not shown) to form third metal posts 342 which protrude downwardly from the bottom surface 302a of the metal wiring patterns 332. After forming the third metal posts, exposed portions of layer 306" are removed and a metal layer 302" (FIG. 4(f)') is patterned by lithography to form the wiring patterns 332 (FIG. 4(g)').

Alternatively to the processing illustrated in FIGS. 4(f)' and 4(g)', third metal posts similar to the third metal posts 342 (FIG. 4(g)') can be formed by plating a metal layer (not shown) within openings in a sacrificial mask layer such as a photoresist layer overlying the metal layer 302. The plated metal layer can be such as to fill the openings therein to form third metal posts which are solid, similar to the metal posts 342 illustrated in FIG. 4(g)'.

FIGS. 5(a)-(f) illustrate a variation of the embodiment described above which results in formation of a multi-layer wiring element 450 having three wiring layers 402, 418, 440 therein, the wiring layers being interconnected by metal posts 412, 422 and conductive connectors 428, 438. In a preliminary stage of fabrication, a base element 414 (FIG. 5(a)) having second metal posts 422 exposed above a second metal layer 418 has a structure such as that shown and described above with respect to FIG. 4(f). As illustrated in FIG. 5(b), a second dielectric layer 426 and another metal layer 440 are laminated to the base element 414, such as by the process described above with reference to FIGS. 1(c) and 1(d). The metal layer 440 of the resulting laminated structure 420 (FIG. 5(c)) then is patterned to form holes 424 exposing top surfaces 425 of the second metal posts 422. Subsequently, second conductive connectors 438 are formed which connect the second metal posts 422 to the third wiring layer 440 (FIG. 5(e)), by processing such as described above (FIG. 1(f)) and the first and third wiring layers then can be patterned to form individual wiring patterns 432, 442, e.g., individual conductive traces or other wiring features of the first and third wiring layers 402, 440, respectively.

FIGS. 6(a) through 6(f) illustrate a method of fabricating an interconnect element in accordance with yet another variation of the embodiment described above with reference to FIGS. 1(a) through 1(f). In this embodiment, the base element 514 varies from the base element 114 (FIG. 1(c)) in that it includes a metal layer 502 having planar portions 504 which define a plane and a plurality of hollow metal protrusions 512 which protrude upwardly from the planar portions 504. The hollow metal protrusions may be provided as a metal layer which is integral with the metal layer of which the planar portions 504 are formed, and may be formed, for example, by stamping or by plating a metal layer onto surfaces of a mandrel followed by removing the mandrel. Alternatively, the base element 514 can include a plurality of metal layers, and the metal layers can each have the same thickness as other such metal layers or can have different thicknesses.

During processing such as illustrated in FIGS. 6(a)-6(b) the base element 514 may be attached to a temporary element such as a carrier for support or to protect the base element from corrosion or chemical attack, for example. In one embodiment, the base element consists essentially of copper. In another embodiment, the base element can include a plurality of layers of metal and the metal protrusions 512 can be of a different layer or layers of metal than the planar portions. Subsequently, in the steps illustrated with respect to FIGS. 6(b) through 6(f) processing such as that described above (FIGS. 1(c) through 1(g)) is performed to produce the multi-layer wiring element 550 as shown in FIG. 6(f).

In a variation of the embodiment illustrated in FIGS. 6(a) through 6(f), the protrusions 512 of the metal layer 502 can be filled with a conductive material, e.g., a plated metal layer, conductive paste, solder or other metallic material such that the final structure has filled conductive protrusions rather than hollow ones as illustrated in FIG. 6(f).

Figure 7:
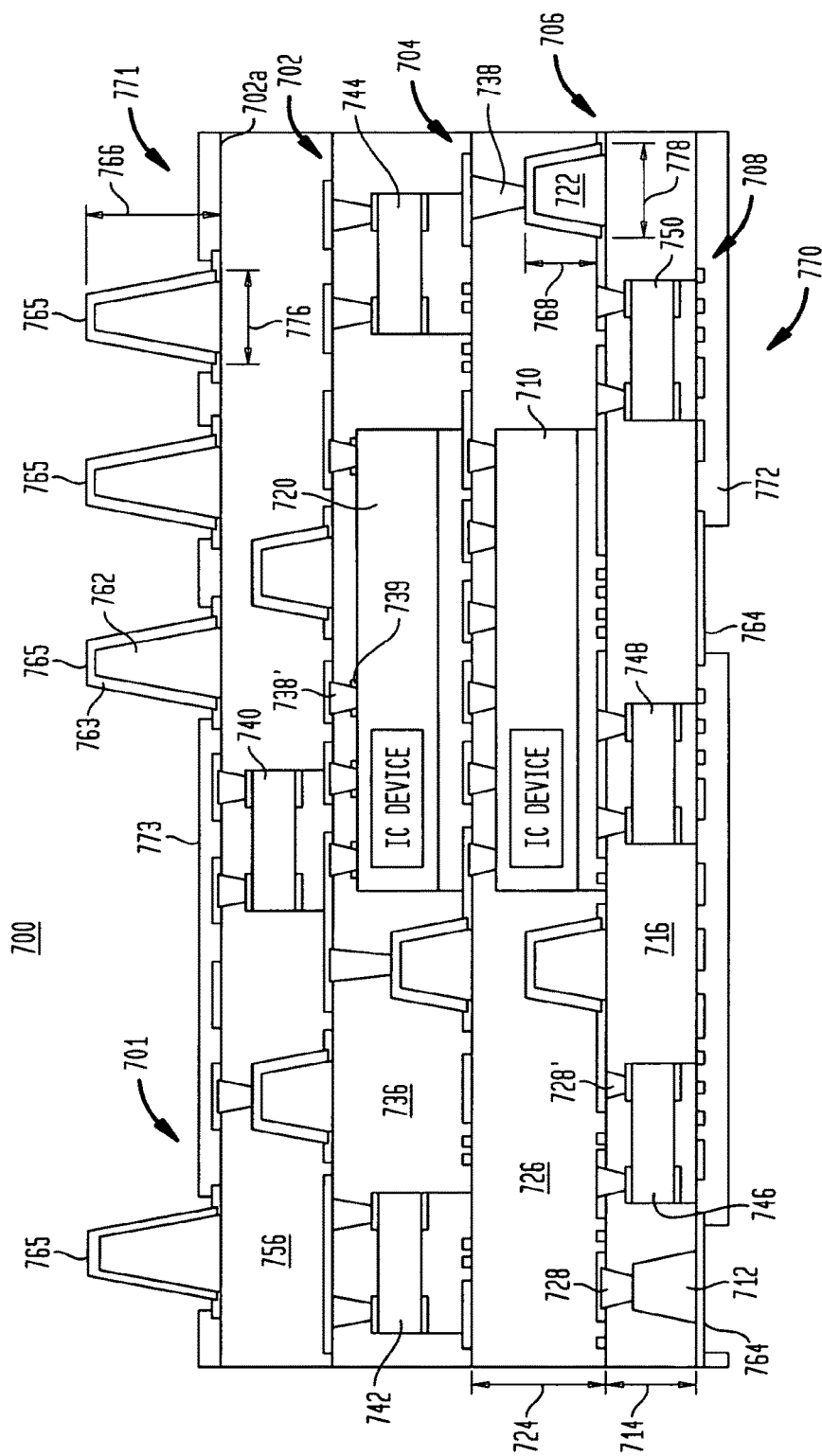
FIG. 7 is a sectional view illustrating a microelectronic assembly including a multi-layer wiring element having microelectronic elements and components incorporated therein in accordance with an embodiment of the invention.

FIG. 7 is a sectional view illustrating a packaged microelectronic assembly 700 in accordance with an embodiment of the invention. As illustrated therein, individual microelectronic elements 710, 720, e.g., integrated circuits, semiconductor chips or microelectromechanical elements ("MEMs") devices, etc., are embedded between patterned wiring layers 702, 704, 706 of the assembly. In a particular example, the microelectronic elements 710, 720 incorporated into the assembly can include one or more processor chips, together with a one or more co-processor chips or associated or related chips. Such chips can be relatively large, extending over areas of 25 millimeters (mm) by 25 mm, for example, and typically have high power density and interconnect density. For example, a single processor chip may consume from tens of Watts to several hundred Watts of power and can require contacts numbering in the hundreds to many thousands to be interconnected at a face of the chip.

The microelectronic elements are encapsulated within dielectric layers 726 and 736, 746 of the assembly, and the assembly 700 also includes dielectric layers 716 and 756. In a particular embodiment, the coefficient of thermal expansion ("CTE") of the dielectric layers is selected to be close to or so as to match that of the semiconductor material, e.g., silicon, from which the microelectronic element is constructed. Additional electric devices 740, 742, 744, 746, 748 and 750, e.g., passive or active components, such as, for example, resistors, capacitors, and inductors or combinations thereof, are embedded between respective wiring layers 702 and 704 or between such wiring layers and other wiring layers 701 and 708. In a particular example, the electric devices can include individual discrete capacitors, discrete resistors or discrete inductors. In another example, multiple electric devices can be provided on individual substrates, such as in form of an "IPOC" (integrated passives on chip), for example. As illustrated in FIG. 7, metal posts 712 and conductive connectors 728 extending upwardly therefrom provide conductive interconnection between adjacent wiring levels, such as, for example, between wiring layers 708 and 706. Likewise, other metal posts 722 and the conductive connectors 738 in contact therewith conductively interconnect wiring layer 706 with wiring layer 708.

As illustrated in FIG. 7, it is not necessary that all dielectric layers 716, 726, 736, 746 and 756 have the same thickness. For example, the thickness 714 of dielectric layer 716 is less than the thickness 724 of dielectric layer 726. The thicknesses may be different in order to accommodate devices or microelectronic elements which have different thicknesses. Although the microelectronic elements 710 can be thinned prior to incorporation into the assembly 700, it may not be desirable to reduce the thickness of each microelectronic element to less than a few tens of microns, e.g., 50 microns, because of increased fragility. As further illustrated in FIG. 7, the metal posts 712, 722 within an interior of the assembly can have equal height, such posts being formed by selectively etching metal layers of uniform thickness, such as described above with respect to FIGS. 1(a) through 1(b) and 4(d) through 4(e). In such case, conductive connectors 738 within the thicker dielectric layer 724 may need to have greater height than the conductive connectors 728 within the thinner dielectric layer 714. Conductive connectors 728', having a construction and fabrication such as the connectors 128 described above with reference to FIG. 1(f), conductively interconnect contacts of the electric devices with patterns of the wiring layer 706. Similarly connectors 738' having such construction and fabrication conductively interconnect contacts 739 at a face of the microelectronic element to patterns of the wiring layer 702. In a particular embodiment, the connectors 738' have a height of between about 5 and 20 microns between an exposed surface of a contact 739 on the microelectronic element and the patterns of the wiring layer 702 to which they are connected.

A plurality of external metal posts 762 protrude upwardly above a top surface 771 of the assembly 700. The metal posts 762 can be arranged in peripheral rows or in a grid pattern. Typically, the external metal posts 762 are arranged at a pitch which is more relaxed, i.e., having a greater value in microns than the pitch of contacts 739 exposed at the face of the microelectronic element 720. Conductive interconnection can be provided to external elements, e.g., to a circuit panel or motherboard through the external metal posts 762. The top surfaces of the external metal posts 762 can be co-planar, the metal posts typically having uniform height 766 from the top surface 702*a* of a dielectric layer 756. The external metal posts 762 may also have uniform width 776 or may have varying widths. In one embodiment, the external metal posts 762 have greater height 766 than a height 768 of metal posts 722 within an interior of the assembly. The width 776 of the external metal posts 762 may also be greater than a width 778 of internal metal posts 722. In addition, the height to width aspect ratio of the external posts 762 may be different from such measure of the internal metal posts 722.

As further shown in FIG. 7, the external posts 762 may also include a wettable conductive layer 763 exposed at a surface thereof. For example, the external metal posts 762 may consist essentially of copper and have external wettable layers of nickel and gold (collectively shown as 763) joined thereto, such as by plating, sputtering, or other method. Top surfaces 765 of the metal posts are co-planar, in order to facilitate external interconnection to other elements (not shown). A cap layer or coating (not shown) of a fusible metal such as a solder, tin or a eutectic coating may further overlie an exposed surface of the metal post 762 or surface of such wettable layer 763 when present. Conductive wettable pads may be exposed at one or more of the top and bottom surfaces or "faces" 770, 771 of the assembly. As illustrated, conductive pads 764, which can be wettable by a fusible metal such as solder, tin or a eutectic composition, are exposed at the bottom face 770 of the assembly. Conductive interconnection of the assembly 700 to one or more external elements such as a circuit panel, motherboard, discrete electric device or other element may be achieved through solder joints extending from the conductive pads 764 to corresponding contacts of such element. Alternatively, the conductive pads 764 can be conductively joined to other conductive elements through diffusion bonds, conductive adhesive, conductive paste or any other suitable method. Solder mask layers 772 and 773 may also overlie wiring layers 708, 701, respectively, with the caveat that the metal posts 762 and pads 764 remain uncovered by the solder mask layers.

Figure 8:
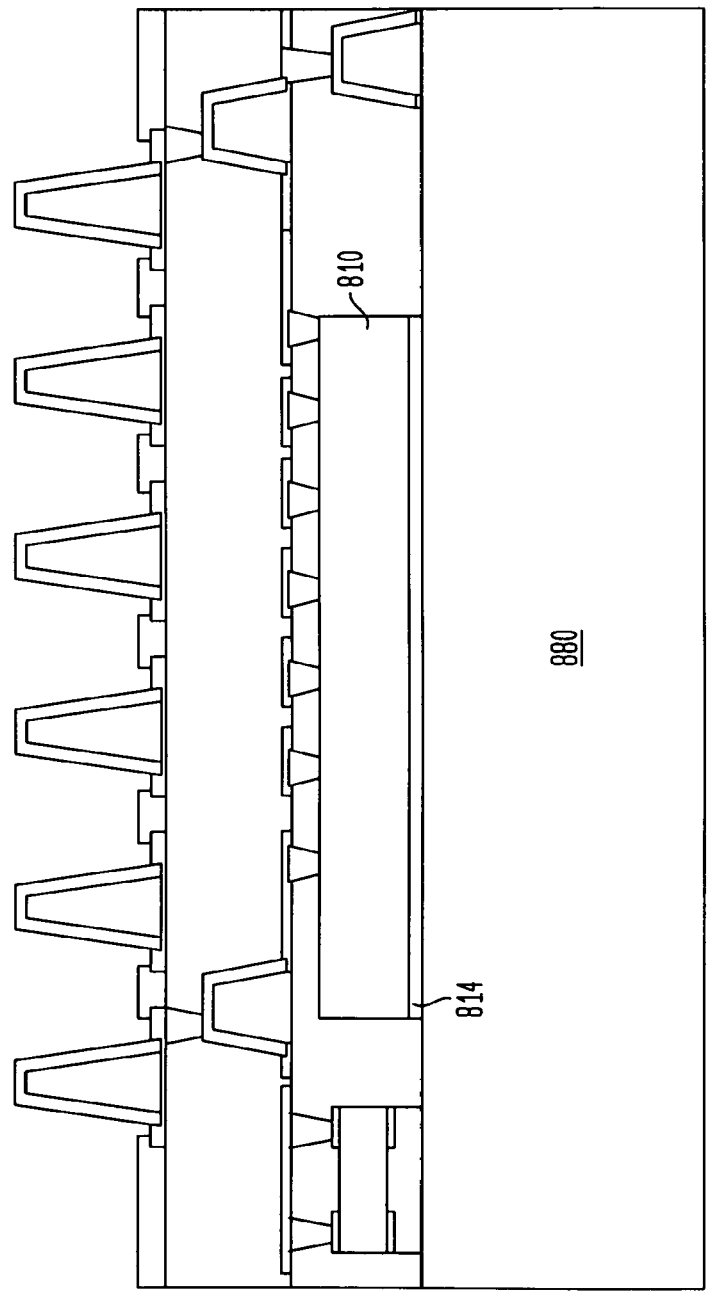
FIG. 8 is a sectional view illustrating a microelectronic assembly including a multi-layer wiring element having a microelectronic element and at least one of an active or passive component incorporated therein and a thermal conductor, in accordance with an embodiment of the invention.
Figure 9A:
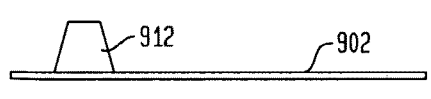
FIGS. 9(a) through 9(h) are sectional views illustrating stages in a method of fabricating a microelectronic assembly such as shown in FIG. 7 in accordance with an embodiment of the invention.
Figure 9E:
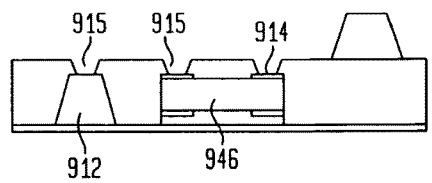
Figure 9B:
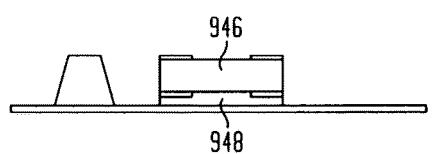
Figure 9F:
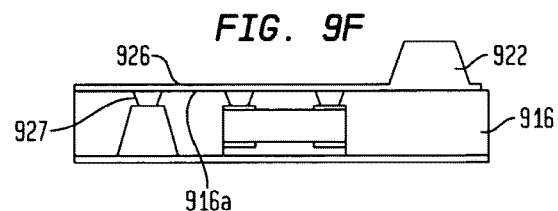
Figure 9C:
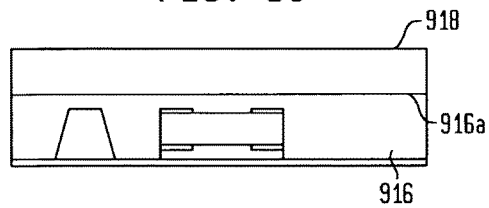
Figure 9G:
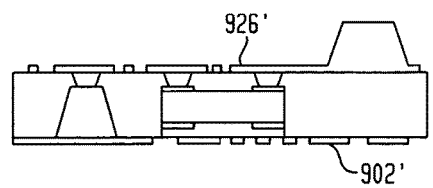
Figure 9D:
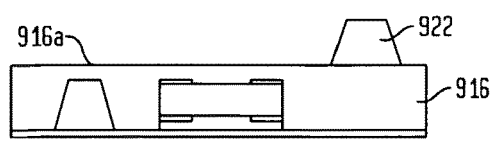
Figure 9H:
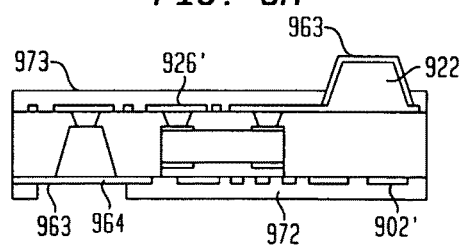

FIG. 8 illustrates a variation of the above embodiment (FIG. 7), wherein a thermal conductor 880, e.g., a solid layer of metal such as copper or aluminum, underlies a microelectronic element 810. The microelectronic element 810 may be attached to the thermal conductor through a thermally conductive adhesive 814. Alternatively, the microelectronic element can be attached to the thermal conductor via a fusible metal such as a solder, eutectic composition or tin, such as when the thermal conductor includes a solid layer of copper. Copper has greater thermal conductivity than aluminum, making copper a suitable choice when high amounts of heat need to be conducted away from a chip having a high power density such as a processor chip, for example.

FIGS. 9(*a*) through 9(*h*) are simplified views illustrating a method of fabricating a microelectronic assembly 700 such as illustrated in FIG. 7. FIG. 9(*a*) illustrates a stage in fabrication similar to that described above with reference to FIGS. 1(*a*)-(*b*) in which a conductive post 912 is formed overlying a metal layer 902. Thereafter, as illustrated in FIG. 9(*b*), an active or passive component 946 or, alternatively, a microelectronic element such as element 720 (FIG. 7) is mounted to the wiring layer 902 through a die attach adhesive or other adhesive connecting a face, e.g., an inactive face, of such device to the wiring layer 902.

Thereafter, as illustrated in FIG. 9(*c*), a dielectric layer 916 and a metal layer 918 are laminated thereto such as through a process as described above with reference to FIG. 1(*c*). The metal layer then is patterned lithographically by an etching process which can be performed selectively with respect to the material exposed at a surface 916*a* of the dielectric layer 916. In the resulting structure, shown in FIG. 1(*d*), second metal posts 922 protrude upwardly from the exposed surface 916*a* of the dielectric layer 916.

Next, as illustrated in FIG. 9(*e*), holes 915 are patterned in the dielectric layer 916 in alignment with top surfaces of posts 912 and with contacts 914 of the electric device 946. Various processes, such as described above with respect to FIG. 1(*e*) can be used to form the holes 915.

As further illustrated in FIG. 9(*f*), a metal layer is formed by electroplating which at least coats inner walls 927 of the holes and forms a continuous metal layer overlying a top surface 916*a* of the dielectric layer 916 and the metal post 922. In one embodiment, the metal layer can consist essentially of copper.

Figure 2:
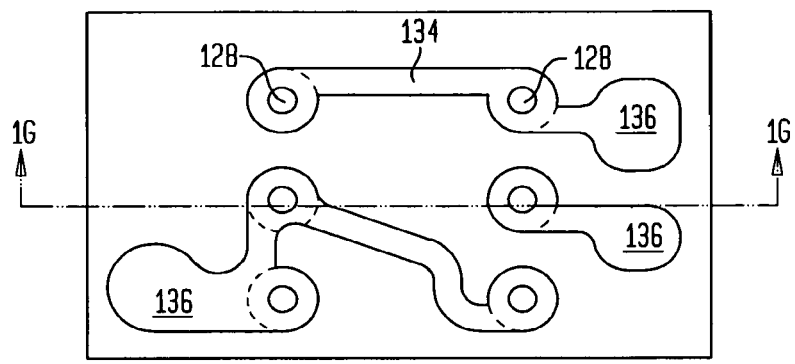
FIG. 2 is a plan view illustrating wiring patterns exposed at a face of a multi-layer wiring element fabricated in accordance with the method illustrated in FIGS. 1(a) through 1(f).

Subsequently, as illustrated in FIG. 9(*g*), the metal layer 902 (FIG. 9(*a*)) and metal layer 926 (FIG. 1(*g*)) are patterned lithographically to form wiring layers 902', 926' including individual conductive patterns, e.g., conductive traces, pads, other elements or combinations thereof.

As further shown in FIG. 9(*h*), solder mask layers 972, 973 then are formed which partially cover the wiring layers 902', 926', leaving a conductive pad 964 and conductive post 922 exposed. The exposed metal features may then be subjected to additional processing such as steps for plating wettable conductive layers 963, such as nickel and gold in succession onto the pad 964 and the conductive post 922.

Figure 10:
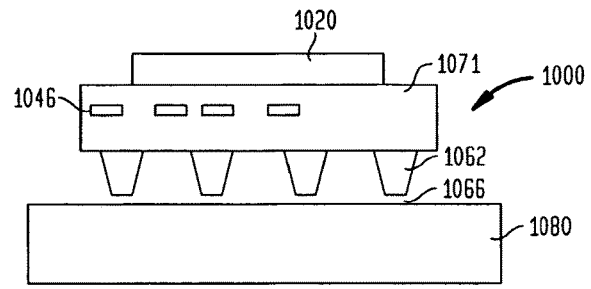
FIG. 10 is a sectional view illustrating a microelectronic assembly having embedded components and a microelectronic device mounted thereto in accordance with an embodiment of the invention.

Various unit-level assemblies and higher-level assemblies can be realized in accordance with principles in accordance with the embodiments of the invention. For example, as illustrated in the sectional view of FIG. 10, a multi-layer wiring assembly 1000 can have a plurality of passive devices 1046 incorporated therein, similar to the electric devices 746 shown and described above (FIG. 7). A microelectronic element 1020 can be externally connected, e.g., via wire-bonding or flip-chip mounting to contacts (not shown) exposed at an exposed face 1071 of the assembly 1000. Conductive interconnection to a circuit panel, e.g., wiring board 1080 can be established through external metal posts 1062 and solder masses 1066 joined thereto.

Figure 11:
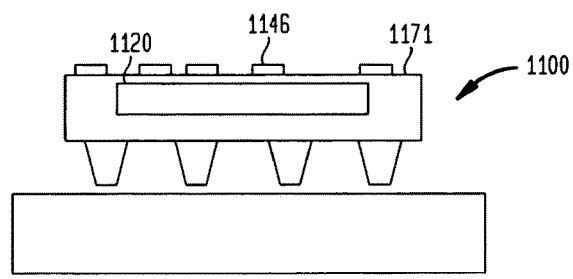
FIG. 11 is a sectional view illustrating a microelectronic assembly having an embedded microelectronic element and components mounted thereto in accordance with an embodiment of the invention.

In another variation, the microelectronic element 1120 (FIG. 11) can be incorporated within the multi-layer wiring assembly 1100, and the electric devices, e.g., passive devices 1146 be mounted to contacts at a face 1171 of the assembly.

In yet another variation, both the microelectronic element 1220 and electric devices 1246 are incorporated within the multi-layer wiring assembly 1200. In the particular embodiment shown, the electric devices 1246 are positioned between the microelectronic element 1220 and an external conductive interface provided by external metal posts 1262. Alternatively, the microelectronic element 1220 can be disposed between the external metal posts 1262 and the electric devices 1246. In another alternative, the electric devices can be disposed adjacent to an edge 1224 of the microelectronic element.

Figure 13:
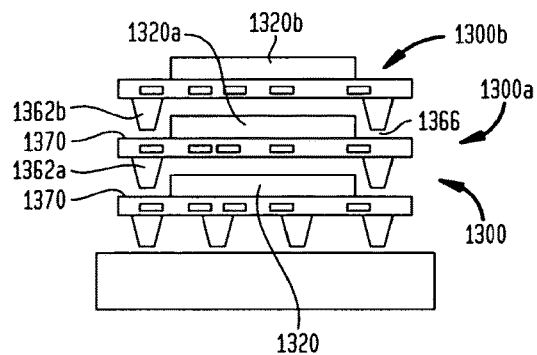
FIG. 13 is a sectional view illustrating a stacked arrangement including a plurality of microelectronic assemblies such as shown in FIG. 10.

FIG. 13 illustrates a higher level assembly in which a plurality of multi-layer wiring assemblies 1300, 1300*a*, 1300*b*, similar to assembly 1000 (FIG. 10), with microelectronic elements 1320 joined to exterior surfaces thereof, are connected together in a stacked arrangement. In such arrangement, the external conductive posts 1362*a*, 1362*b* may be confined to peripheral regions, such as to provide space for microelectronic elements 1320, 1320*a*, 1320*b* to fit between the posts. The conductive posts 1362a, 1362b can be joined through solder masses 1366 to conductive pads (not shown) exposed at faces 1370 of the adjacent assembly 1300a, 1300.

Figure 12:
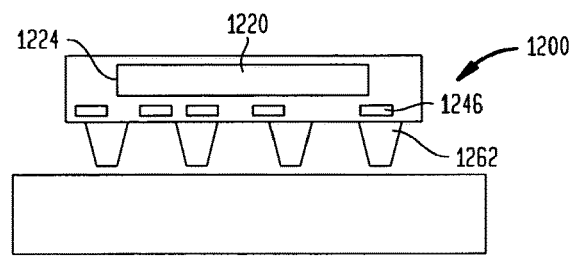
FIG. 12 is a sectional view illustrating a microelectronic assembly having an embedded microelectronic element and embedded components in accordance with an embodiment of the invention.
Figure 14:
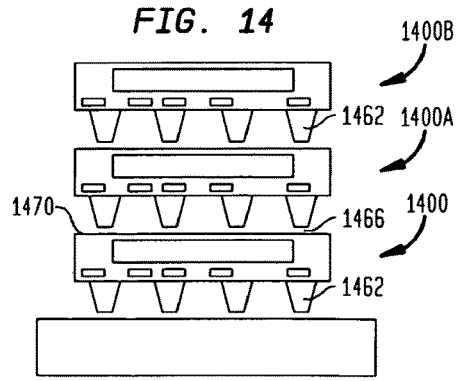
FIG. 14 is a sectional view illustrating a stacked arrangement including a plurality of microelectronic assemblies such as shown in FIG. 12.

FIG. 14 illustrates a different arrangement which includes a plurality of conductively connected stacked multi-layer wiring assemblies 1400, 1400a and 1400b, each having microelectronic elements and electric devices incorporated therein, similar to assembly 1200 shown in FIG. 12. In this case, the external metal posts 1462 can be arranged in an area grid array for connection through solder masses 1466 to corresponding conductive pads (not shown) exposed at a face 1470 of each assembly 1400.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention.

What is claimed is:

1. A method of fabricating an interconnect element having a plurality of wiring layers separated from each other by at least one dielectric layer, comprising:
   (a) laminating a dielectric layer, a first metal layer atop the dielectric layer, and a second metal layer atop the dielectric layer onto a base element, wherein the base element includes a third metal layer having at least portions defining a plane and a plurality of conductive protrusions extending upwardly from the plane, wherein the first metal layer includes first openings, and wherein the laminating is performed such that portions of the dielectric layer separate adjacent ones of the conductive protrusions; and then
   (b) forming second openings in the dielectric layer which are aligned with the first openings so that at least top surfaces of the conductive protrusions are exposed through the first and second openings; and
   (c) plating a metal onto the exposed top surfaces of the conductive protrusions within the first and second openings to form plated features connecting the conductive protrusions with the first metal layer.

2. A method as set forth in claim 1, further comprising patterning the third metal layer to form wiring patterns after forming the plated features.

3. A method as set forth in claim 1, further comprising patterning the first metal layer to form wiring patterns after forming the plated features.

4. A method as set forth in claim 1, wherein the dielectric layer includes an uncured dielectric element and step (a) is formed by pressing the uncured dielectric element onto the third metal layer and the conductive protrusions thereon at a temperature of about 200° C. or less and then curing the uncured dielectric element.

5. A method as set forth in claim 1, wherein during step (a), the first and third metal layers define continuous planes.

6. A method as set forth in claim 1, wherein step (a) includes laminating the first metal layer onto the base element such that the first openings therein are aligned with the conductive protrusions.

7. A method as set forth in claim 1, further comprising, patterning the second metal layer to form second conductive protrusions extending upwardly from the first metal layer.

8. A method as set forth in claim 1, further comprising etching a fourth metal layer attached to the third metal layer to form the conductive protrusions of the base element.

9. A method as set forth in claim 1, wherein the conductive protrusions include hollow conductive protrusions.

10. A method as set forth in claim 7, further comprising:
   (d) laminating a second dielectric layer and a fourth metal layer atop the dielectric layer onto the first metal layer and the plurality of second conductive protrusions extending upwardly therefrom such that portions of the second dielectric layer separate adjacent ones of the second conductive protrusions;
   (e) forming third openings in the second dielectric layer which expose at least top surfaces of the second conductive protrusions; and
   (f) plating a metal onto the exposed surfaces of the second conductive protrusions within the third openings in the second dielectric layer to form second plated features connecting the second conductive protrusions with the fourth metal layer.

11. A method as set forth in claim 10, wherein during step (d) the first, second and fourth metal layers define continuous planes.

12. A method as set forth in claim 10, wherein during step (d), at least one of the first and fourth metal layers includes a plurality of individual traces extending in directions defining a plane.

13. A method as set forth in claim 10, wherein when the fourth metal layer is laminated with the second dielectric layer onto the first metal layer and second conductive protrusions extending therefrom in step (d), the fourth metal layer has openings aligned with the second conductive protrusions and the fourth metal layer is attached to a fifth metal layer overlying the fourth metal layer.

14. A method as set forth in claim 13, further comprising, prior to step (e), patterning the fifth metal layer to form third conductive protrusions extending upwardly from the fourth metal layer.

15. A method of packaging a microelectronic element between wiring layers of an interconnect element having a plurality of wiring layers separated from each other by at least one dielectric layer, comprising:
   forming openings through a first metal layer;
   laminating a dielectric layer, the first metal layer atop the dielectric layer, and a second metal layer atop the dielectric layer onto a first element, the first element including a third metal layer having at least portions defining a plane, a plurality of conductive protrusions extending upwardly from the plane and a microelectronic element having a first face adjacent to the plane, the laminating performed such that portions of the dielectric layer separate adjacent ones of the conductive protrusions and separate the microelectronic element from the conductive protrusions, wherein the first metal layer includes first openings, at least some of the first openings being aligned with the plurality of conductive protrusions, and other of the first openings aligned with contacts at an opposed second face of the microelectronic element; and then
   forming second openings in the dielectric layer, wherein some of the second openings are aligned with the first openings aligned with the contacts so as to expose the contacts through corresponding first and second openings and wherein other of the second openings are aligned with the first openings aligned with at least the top surfaces of the conductive protrusions so as to expose the at least top surfaces of the conductive protrusions through corresponding first and second openings; and plating a metal onto the exposed contacts and exposed surfaces of the conductive protrusions within the first and second openings to form plated features connecting the contacts and the conductive protrusions with the first metal layer.

16. A method as set forth in claim 15, wherein the third metal layer includes a thermally conductive plate attached to the first face of the microelectronic element.

17. A method of forming an interconnect element including at least one of an active or passive component between respective wiring layers of the interconnect element having a plurality of wiring layers separated from each other by at least one dielectric layer, comprising:

laminating a dielectric layer, a first metal layer atop the dielectric layer, and a second metal layer atop the first metal layer onto a first element, the first element including a third metal layer having at least portions defining a plane, wherein a plurality of conductive protrusions extend upwardly from the plane and at least one of an active or passive component have a surface overlying the plane, wherein the first metal layer includes first openings, at least some of the first openings being aligned with contacts of the at least one of the active or passive component, and wherein other of the first openings are aligned with at least top surfaces of the conductive protrusions, the step of laminating performed such that portions of the dielectric layer separate adjacent ones of the conductive protrusions and the active or passive component from each other; and then forming second openings in the dielectric layer, wherein some of the second openings are aligned with the first openings aligned with the contacts so as to expose the contacts through corresponding first and second openings and wherein other of the second openings are aligned with the first openings aligned with the conductive protrusions so as to expose at least top surfaces of the conductive protrusions through corresponding first and second openings; and plating a metal onto the exposed contacts and exposed surfaces of the conductive protrusions within the first and second openings to form plated features connecting the contacts and the conductive protrusions with the second metal layer.

18. The method of claim 1, wherein during step (a) the first metal layer further includes individual wiring patterns.

19. The method of claim 15, wherein during step (b), the first metal layer further includes individual wiring patterns.

* * * * *